United States Patent [19]

Kuenemund

[11] 4,393,356

[45] Jul. 12, 1983

[54] FILTER CIRCUIT FOR ELECTRIC WAVES

[75] Inventor: Friedrich L. Kuenemund, Munich, Fed. Rep. of Germany

[73] Assignee: Siemens Aktiengesellschaft, Berlin & Munich, Fed. Rep. of Germany

[21] Appl. No.: 151,772

[22] Filed: May 21, 1980

Related U.S. Application Data

[63] Continuation of Ser. No. 630,932, Nov. 11, 1975, abandoned.

[30] Foreign Application Priority Data

Nov. 12, 1974 [DE] Fed. Rep. of Germany ....... 2453669

[51] Int. Cl.³ ..................... H03H 11/04; H03H 17/00
[52] U.S. Cl. ..................................... 333/165; 333/173
[58] Field of Search ............... 333/165, 166, 173, 167, 333/138; 328/151, 167; 307/221 D, 221 C

[56] References Cited

U.S. PATENT DOCUMENTS

| | | | |
|---|---|---|---|
| 3,513,401 | 5/1970 | Tokunaga | 328/167 |
| 3,621,402 | 11/1971 | Gardner | 328/167 |
| 3,668,662 | 6/1972 | Zimmerman et al. | 333/138 X |
| 3,676,711 | 7/1972 | Ahrons | 307/221 C |
| 3,716,729 | 2/1973 | Rollett | 333/124 X |
| 3,815,056 | 6/1974 | Meyer et al. | 333/150 |
| 3,831,116 | 8/1974 | Davis, Jr. et al. | 330/5.5 X |
| 3,879,673 | 4/1975 | Shaw | 330/5.5 |
| 3,890,582 | 6/1975 | Jeong | 333/24.2 |
| 3,925,805 | 12/1975 | Erb | 307/221 D X |
| 3,940,720 | 2/1976 | Harrington | 333/150 |
| 3,944,850 | 3/1976 | Walden | 307/221 D |
| 3,971,998 | 7/1976 | Gopinath et al. | 328/167 |

OTHER PUBLICATIONS

Dietrich—"Microwave Integrated Circuits", The Bell System Technical Journal, vol. 50, No. 7, Sep. 1971; pp. 2175-2194.

Lockhart et al.—"Binary Transversal Filters Using Recirculating Shift Registers", The Radio and Electronic Engineer, vol. 43, No. 3, Mar. 1973; pp. 224-226.

Primary Examiner—Marvin L. Nussbaum
Attorney, Agent, or Firm—Hill, Van Santen, Steadman, Chiara & Simpson

[57] ABSTRACT

A filter circuit for electrical waves including at least one line which supplies electrical input waves and at least one line for withdrawing output electrical waves and in which the frequency dependent transmission characteristic is determined by coupled line loops each of which is in the form of a line ring and wherein coupling between the line loops is unidirectional and the individual line loops are designed so that they have unidirectional transmission characteristics.

6 Claims, 14 Drawing Figures

Fig. 9 a) 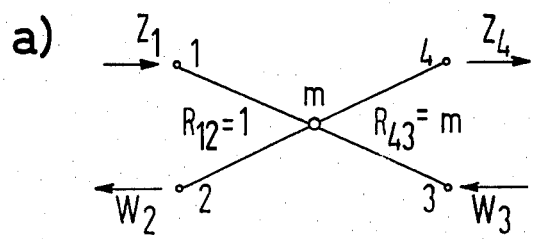

b) $$B_m = \frac{1}{2} \left\| \begin{array}{cc} \sqrt{m} + \frac{1}{\sqrt{m}} & \sqrt{m} - \frac{1}{\sqrt{m}} \\ \sqrt{m} - \frac{1}{\sqrt{m}} & \sqrt{m} + \frac{1}{\sqrt{m}} \end{array} \right\|$$

c) $$K_m = \left\| \begin{array}{cc} \sqrt{m} & 0 \\ 0 & \frac{1}{\sqrt{m}} \end{array} \right\| \quad m \leq 1$$

d) 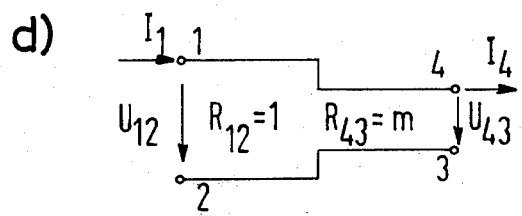

e) $$\left\| \begin{array}{c} Z_1 \\ W_2 \end{array} \right\| = B \left\| \begin{array}{c} W_3 \\ Z_4 \end{array} \right\| \qquad \left\| \begin{array}{c} U_{12} \\ I_1 \end{array} \right\| = K \left\| \begin{array}{c} U_{43} \\ I_4 \end{array} \right\|$$

Fig. 10 a

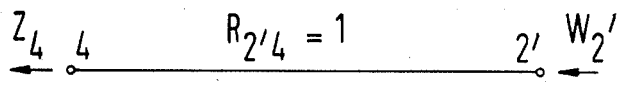

b
$$\left\| \begin{array}{c} W_3 \\ Z_4 \end{array} \right\| = \left\| \begin{array}{cc} e^{jb} & 0 \\ 0 & e^{-jb} \end{array} \right\| \cdot \left\| \begin{array}{c} Z_1' \\ W_2' \end{array} \right\|$$

c
$$\left\| \begin{array}{c} U_{43} \\ I_4 \end{array} \right\| = - \left\| \begin{array}{cc} \cos b & j \sin b \\ j \sin b & \cos b \end{array} \right\| \cdot \left\| \begin{array}{c} U_{1'2'} \\ I_{1'} \end{array} \right\|$$

d
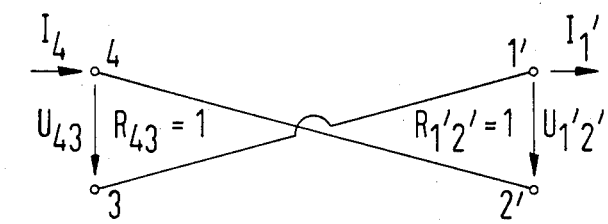

e
$$\left\| \begin{array}{c} W_3 \\ Z_4 \end{array} \right\| = B_L \left\| \begin{array}{c} Z_1' \\ W_2' \end{array} \right\| = \left\| \begin{array}{cc} e^g & \varphi^* \\ \varphi & e^{g*} \end{array} \right\| \cdot \left\| \begin{array}{c} Z_1' \\ W_2' \end{array} \right\|$$

$$\left\| \begin{array}{c} U_{43} \\ I_4 \end{array} \right\| = K_L \left\| \begin{array}{c} U_{1'2'} \\ I_{1'} \end{array} \right\| = \left\| \begin{array}{cc} K_{11} & K_{12} \\ K_{21} & K_{22} \end{array} \right\| \left\| \begin{array}{c} U_{1'2'} \\ I_{1'} \end{array} \right\|$$

f
$$\left| e^g \right| = \frac{1}{2} \left| K_{11} + K_{22} + \dot{K}_{12} + \dot{K}_{21} \right| = \left| \sqrt{1 + \varphi \varphi^*} \right|$$

Fig. 11
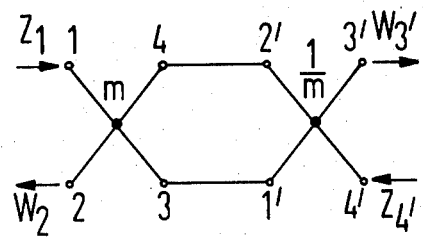
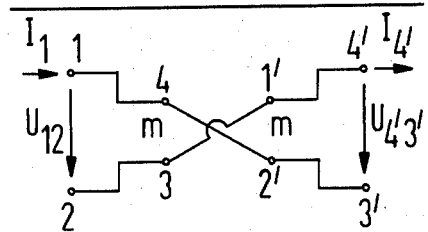
$$A_m = K_m \cdot K_L \cdot K_m^{-1}$$
$$\left|e^{g_m}\right| = \sqrt{1 + \left|j\frac{1}{2}\left(\frac{1}{m} - m\right)\sin b\right|^2}$$
$$\eta = f/f$$
$$\sin b = \sin n\pi\eta \approx (-1)^n n\pi(\eta - 1)$$
Fig. 14
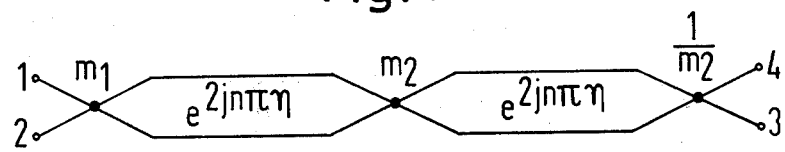

FILTER CIRCUIT FOR ELECTRIC WAVES

This is a continuation of application Ser. No. 630,932, filed Nov. 11, 1975, now abandoned.

BACKGROUND OF THE INVENTION

1. Field of the Invention

This invention relates in general to transmission lines, filter ring circuits and coupling circuits and in particular to a novel filter circuit for electrical waves.

2. Description of the Prior Art

In the transmission of information by means of electric communications transmission systems, the problem frequently occurs that only the signals lying within specific frequency bands are to be transmitted, with the simultaneous suppression of signals which lie in adjacent or adjoining frequency bands. For this purpose filters are used which, in the conventional technique, generally consist of coils and capacitors. These electric components possess the disadvantage, however that they possess relatively large dimensions in particular in the region of the lower frequencies, such as in the low frequency band and in the frequency band extending to a few hundred megahertz.

Therefore in particular in the field of the so-called integrated construction mode, new filter concepts have been investigated and in fact discovered. Until now these have basically consisted in the complete avoidance of coils where possible and by using appropriate transducers to derive the electric properties of coils from the electric behaviour of capacitors (gyrator filter). One has also adopted the procedure of forming appropriate filters from resistors and capacitors, possibly with interposed amplifiers in order to compensate the relatively high fundamental attenuation of such filters. In another group of modern filter circuits—the so-called computer filters—special logic linking circuits are used to influence the signals in frequency-dependent fashion. However, a common feature of all these and a series of other integrated filter concepts which have become known in the meantime is that they require a relatively high outlay.

In the context of very short electromagnetic waves, for examples having frequencies of above 2 to 3 GHz, a filter concept is known in which the electric signals are conducted to a line which is connected via a directional coupler to at least one enclosed line loop, a so-called line ring. An essential feature of this type of filter is that the coupling takes place via a directional coupler which undertakes input-coupling into the line loop in the one direction of circulation in as unweakened as possible a form or in accordance with a given coupling factor, whereas in the other direction of circulation of the line loop it substantially suppresses input coupling, or coupling. This type of filter has previously failed as far as lower frequencies are concerned, in that both an electric and a magnetic coupling are required to simulate the directional coupling, and that the line loop would generally have to possess much too large dimensions in order, for example to ensure the desired pass characteristics of the electric filter circuit in the low frequency band or in the band extending to a few Megahertz.

SUMMARY OF THE INVENTION

The aim of the invention is, in electric filter circuits, to find a new way in which the difficulties referred to in the introduction relating to the known integrable filter circuits can be avoided even in operating frequencies extending to a few Megahertz. Here the invention employs the ring line filter concept for microwaves, as mentioned above.

On this basis, the aim of the invention is realised, in accordance with the invention in that the coupling is an undirected coupling, and that the individual line loop is designed in such manner that it possesses unidirectional transmission behaviour.

It is also possible for a plurality of line loops in accordance with the invention to be connected in a chain in known manner.

The invention is of particular significance for channel filters of carrier frequency devices and t.d.m. devices. A channel filter is, as is known, to be understood as a filter having band-pass characteristics which serves for example to filter out a speech frequency band of 3 to 4 kHz band width.

The unidirectional transmission properties of the individual line loop can be realised in various ways. In accordance with one advantageous possibility, a so-called bucket chain circuit—i.e. an electric storage device for analogue signals—is used in which the transmission speed, or in other words, the transit time of a signal from the input to the output is determined by the stepping pulse train of the bucket chain circuit. Devices of this type are known e.g. from IEEE Solid State Circuits Vol. 4 (June 1969), Edition 3, pages 131 to 136. Instead of such bucket chain circuits, it is also possible to use so-called CCDs, i.e. devices operating by the principle of coupled charges, such as described for example in BSTJ Ed. 49 (1970), pages 589 to 593. Here too a so-called pulse generator serves to determine the transit time of a signal specimen which is fed into the input and withdrawn at the output of the CCD. Further reference could be made to the magazine "Elektronik", published by Franzis-Verlag, Munich, 23rd Edition No. 1/1974,, the article entitled "Ladungsverschiebeschaltungen" and bibliography. Finally another advantageous possibility consists in enforcing unidirectional properties by inserting a four-pole which is basically transmissive only on one side. As an example in this respect one might quote a line loop which is designed in known manner as delay line and into which is inserted an emitter follower stage in a semiconductor design.

It is also advantageous if one interposes into the individual line loop at least one amplification element whose amplification value is selected, in dependence upon the transmission attenuation in the line loop, to be sufficiently low to ensure that a residual attenuation which differs from zero, but which is as low as possible, remains in the line loop.

BRIEF DESCRIPTION OF THE DRAWINGS

FIG. 9 in portions (a) through (e) illustrate an arrangement with one line element in common and give the circuit characteristics including the chain matrix link wave value;

FIG. 10 in portions (a) through (f) illustrates a four-pole network with its various characteristics;

FIG. 11 illustrates combinations of the arrangements of FIGS. 9 and 10 and the characteristics;

FIG. 14 illustrate the surge impedance coupling of a chain of rings.

DESCRIPTION OF THE PREFERRED EMBODIMENTS

In the following the invention will be explained in detail making reference to exemplary embodiments.

Figure 1:
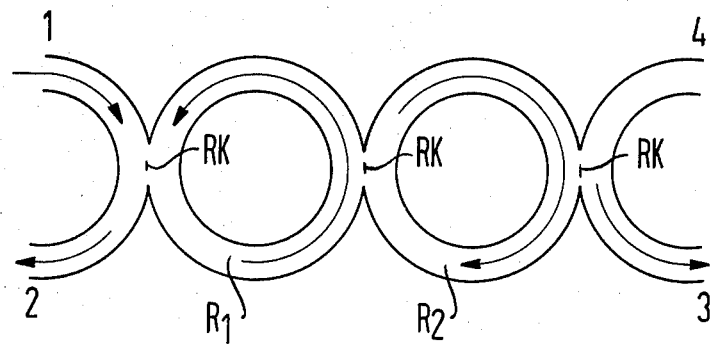
FIG. 1 illustrates a ring filter of the prior art.

FIG. 1 shows a known ring filter constructed as a hollow conductor such as described, for example, in the magazine "Nachrichtentechnik" 1963, p. 293 ff, by Dr. Jaumann. The signals which are to be treated in respect of frequency by means of the filter are supplied and discharged via a line 1, 2. Via a directional coupler RK a first ring resonator R1 is connected to the line 1, 2, said ring resonator R1 being connected via another directional coupler RK to a second ring resonator R2 which is connected via a further directional coupler RK to a line 3, 4. In the individual lines and resonators arrows indicate the direction of propagation determined by the directional couplers and the feed-in direction. A wave fed into 1 appears at the output of 3 whenever the electric length of the individual line resonator amounts to a whole-numbered multiple of the corresponding wave length of the wave. Here the directional coupler at the individual coupling points is essential to the security in this known filter concept.

Figure 2:
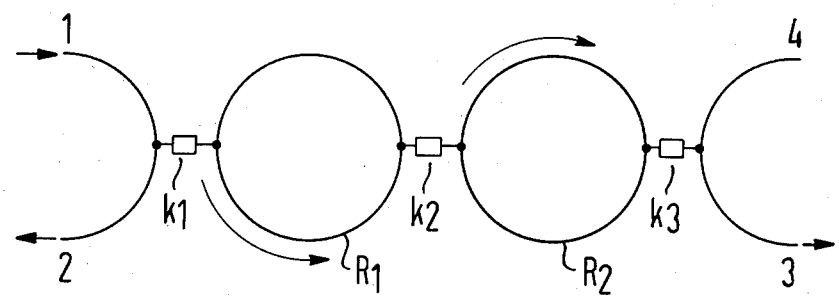
FIG. 2 illustrates a filter of the invention.

FIG. 2 shows a filter designed in accordance with the invention, as comparison to the known filter circuit shown in FIG. 1. Directional input-coupling from the line 1, 2 into the line loop R1 has been deliberately avoided and instead an undirected coupling of R1 to 1, 2 is provided via a coupling element. Equally, an undirected coupling is provided between R1 and R2 and between R2 and 3, 4. The couplings are referenced K1, K2 and K3 and, in dependence upon the relevant filter requirements, can be selected to be equal or to differ. An essential feature of the filter in accordance with the invention is also that, in contrast to the known design shown in FIG. 1, the line loops or rings R1, R2 are designed in such manner that they possess unidirectional transmission properties. Here "unidirectional" is to be understood in that in the one transmission direction, namely in the direction which is opposite to the arrow, practically no energy propagation takes place, whereas in the direction of propagation which is in conformity with the arrow an unweakened as possible a transmission of the energy fed in via K1 and K2 takes place. It is also important that the output coupling of the energy from a line loop R, e.g. R2 of this kind should also take place in undirected fashion.

Figure 3:
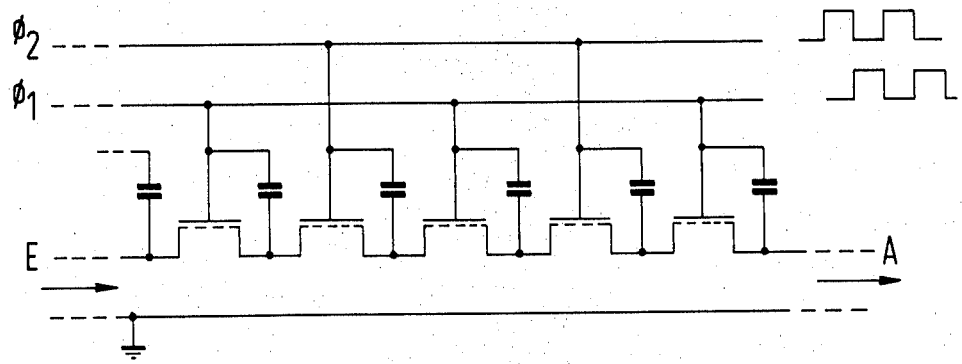
FIG. 3 illustrates a unidirectional line.
Figure 4:
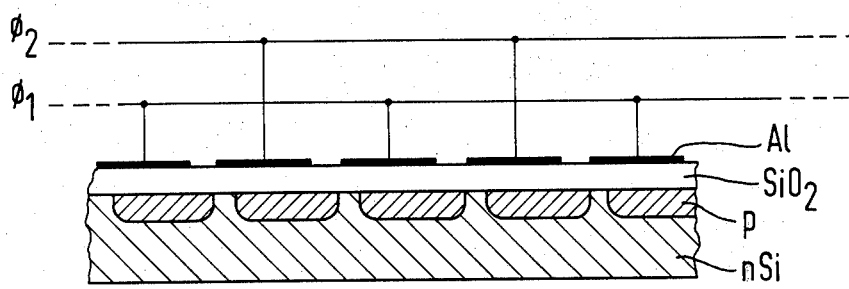
FIG. 4 illustrates another example of a unidirectional line.
Figure 5:
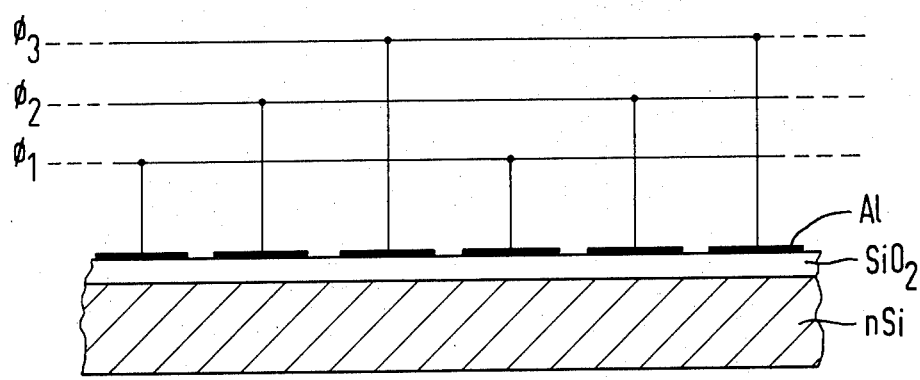
FIG. 5 illustrates another example of a unidirectional line.

FIGS. 3, 4 and 5 firstly show a few forms of unidirectional lines.

FIG. 3 shows a known bucket chain circuit in which the analogue signal which is to be transmitted in stepped fashion is fed-in in the direction of the arrow between reference potential and control electrode. By means of the pulse train lines $\phi_1$ and $\phi_2$ the analogue signal is stepped on in known manner in the form of specimens (see the publications). It can be withdrawn, with a corresponding time delay, at the output provided with an output arrow. As shown, the pulse train phases $\phi_1$ and $\phi_2$ are usually displaced in phase by 180°. FIG. 4 shows a bucket chain circuit of this type designed as integrated circuit in which form it is freely available on the market. For example arranged on a n-conducting silicon substrate are zones p which geometrically are arranged in series and are rendered p-conducting by appropriate diffusion. The entire arrangement is coated with a capacitor-dielectric composed of silicon-dioxide which simultaneously serves as insulation, and the capacitors of the equivalent circuit shown in FIG. 3 are applied as conductive aluminum coatings. In the drawing the silicon substrate is referenced nSi.

FIG. 5 shows a further development of a bucket chain circuit of this type, in the most recent form of construction—the so-called CCD (charge coupled device). The designations are fundamentally in conformity with those used in FIGS. 3 and 4. Only three pulse train lines $\phi_1$, $\phi_2$, and $\phi_3$ are provided. With regard to the mode of operation, reference is made to the literature quoted in the introduction. CCDs also exist which possess fewer pulse train lines and more pulse train lines, for example having two or four pulse train lines. All these types of construction can also be used within the scope of the invention.

The CCDs or bucket chain circuits of this type are now, in accordance with the invention, connected to form a ring in that their input E is connected to their output A. The electric length of such a ring line is then fundamentally determined exclusively by the pulse train frequency $\phi_1, \phi_2 \ldots \phi_\mu$, in dependence upon how many pulse train phases are required by the bucket chain circuit or the CCD. The dimensioning of the electric length of the bucket chain circuit or line loop which is conducted to form a loop or a ring is now selected to be similar to that of the known micro-wave ring line filters described in the introduction i.e. for electric waves which are to pass through, the circulation length in the line loop must be a whole-numbered multiple of the electric wave length of the signal, thus n2π(with n=1, 2, 3 . . . whole number). This means that the electric length of the line loop, relative to the signal, is replaced by the phase information.

Figure 6:
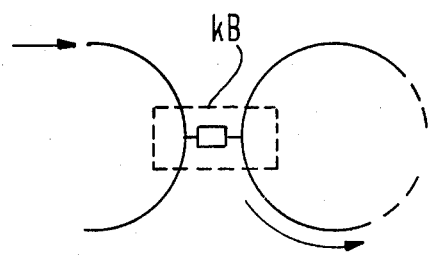
FIG. 6 illustrates the basic coupling between ring elements in the circuit of FIG. 2.

FIG. 6 shows the basic coupling zone KB which is bordered by a broken line to distinguish it in the overall circuit shown in FIG. 2.

Figure 7:
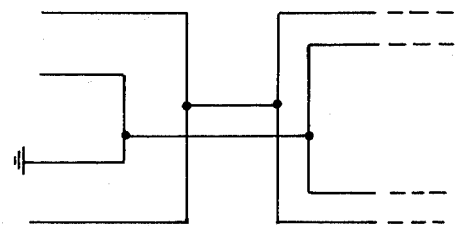
FIG. 7 illustrates resistive coupling arrangements.

Pure galvanic coupling is possible (FIG. 7).

It is possible to insert components into each of the two connection lines of the lines which are to be connected to one another.

Figure 8:
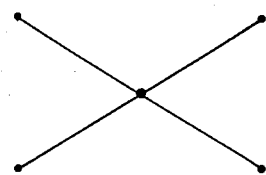
FIG. 8 is a schematic illustration of the circuit of FIG. 7.

FIG. 8 shows the corresponding symbol.

In FIG. 9 the theoretic network bases of the filter circuits composed of unidirectional lines are represented.

For the sake of simplicity, only one line element is to be located between the illustrated connection terminals 1, 2 and 3, 4.

In FIG. 9 the lines 1, 2 and 3, 4 possess one line element in common, or in each case at least one line element of various lines are conductively connected to one another. Here the surge impedances of the two lines 1, 2 and 3, 4 differ from one another. The ratio $R_{43}$ to $R_{12}$ is referenced as coupling factor m, similarly to the standing wave ratio ("VSWR") likewise referenced m in the micro-wave technique.

Under the equivalent circuits of the coupling points, under the description of the figures, the associated operating chain matrices B are given since it is simpler, in respect of the general application of the principle being described, to deal with wave values rather than currents and voltages. As indicated by row e, as is known the operating chain matrix links wave values at the input with wave values at the output of a network. Here the input values are the wave $Z_1$ approaching the coupling point and the wave $W_2$ departing from the coupling point. The output values are then $W_3$ and $Z_4$.

This matrix form was selected to enable the calculation of the simplest possible chain matrices which are shown as row c, and thus to produce correspondingly simple, known equivalent circuits which are entered, correspondingly as row d. In the FIGS. 9 to 11, row e in conjunction with row d shows how the chain matrix in each case links voltage and current at the input to voltage and current at the output.

In this way the new types of four-gate circuits for the calculations can be traced back to known two-gate circuits.

This has also been represented for two unidirectional lines in FIG. 10 which are at least approximately parallel and which are transmissive in opposite directions. The surge impedance of the lines 1, 2 and 3, 4 has again been assumed to be standardized to 1.

The minus sign in front of the matrix in row c of FIG. 10 and the corresponding line intersection in row d of FIG. 10 have been introduced to enable the resonator calculation in FIG. 11 to be carried out simply by multiplication of chain matrices, as represented in row c of FIG. 11. This also applies to the chosen designation of the connection terminals.

FIG. 10, row f shows how the attenuation function $e^g$ which contains all the network properties of a four-pole can be obtained from the chain matrix (FIG. 10, row e) or from the operating chain matrix.

The following may be commented on the phase constant in respect of electronic lines: When the pulse train frequency of the electronic line $F_o = 1/T_o$ is sufficiently higher than the frequency $f_o$ of the signal which is to be transmitted, the wave-propagation speed v can be expressed by $$v = 2 \text{ line elements: } T_o = \frac{2}{T_o}$$

The number of line elements $\lambda$ which represents a wave length at the frequency $f_o$ is then obtained with $$\lambda = \frac{v}{f_o} = \frac{2}{T_o f_o}$$

and thus a line of the phase $2\pi$.

FIG. 11 represents circuits with resonator effects which consist of a corresponding chain connection of elements from FIGS. 9 and 10. The resonator effect is indicated by the attenuation function in rows d and e of FIG. 11.

Row e of FIG. 11 gives the equations for the line phase, with which the corresponding attenuation functions—see row d—are equal to one. Both of these are equations known in the line technique (see e.g. W. W. Mumford: "Maximally Flat Filters in Wave Guides", B.S.T.J. 27 (1948), pages 684–713.)

This produces the further possibility of using a decoupled chain connection of resonators of this type to produce the zero positions of the attenuation function, which inevitably in accordance with the filter theory lie in the left half of the complex p-frequency plane, in a direct and individual fashion, as this amounts to a multiplication of the individual attenuation functions, and thus to the radio filter circuits proposed by R. Feldtkeller ("Einfuehrung in die Theorie der Rundfunksiebschaltungen", Prof. Dr. R. Feldtkeller, 3rd Edition, 1945, IX S. Hirzel Verlag Leipzig).

It must also be mentioned that the number of closed line loops will depend upon how many resonances or circuits are required by the filter circuit. Therefore the case of the filter possessing two circuits, which has been considered, is only an example to facilitate the understanding of the invention.

In practice, it is advisable, in particular in the case of the bucket chain principle, to conduct the analogue signal firstly via a so-called sampler which at equidistant points of time obtains from the analogue signal amplitude specimens for further processing. To ensure that the known sampling theory is fulfilled, here it should be ensured that the sampling frequency is at least double that of the highest of the frequencies which are to be transmitted. However, in many cases it is advantageous to select this sampling frequency to be noticeably higher, as it is also necessary to take into consideration the frequency of the stepping motion in the line loops, thus the pulse train frequency for example in the bucket chain circuit which is preferably selected to be equal to the sampling frequency.

Figure 12:
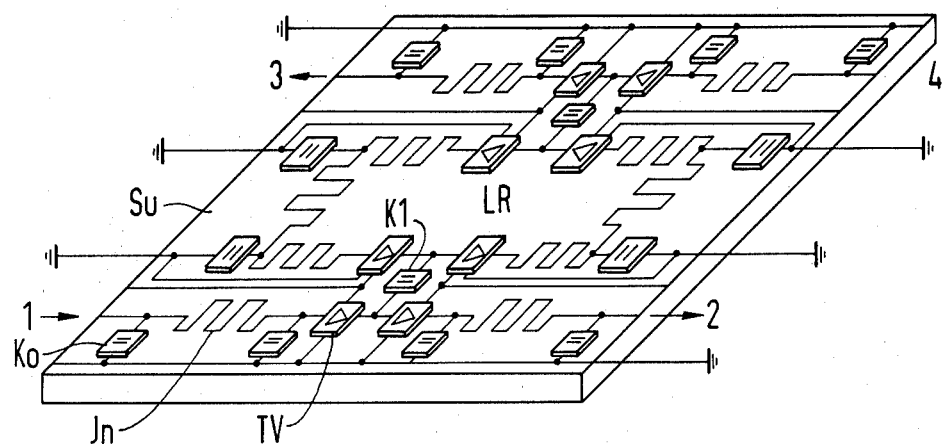
FIG. 12 is a perspective view of a substrate with an example of filter circuits according to the invention.
Figure 13:
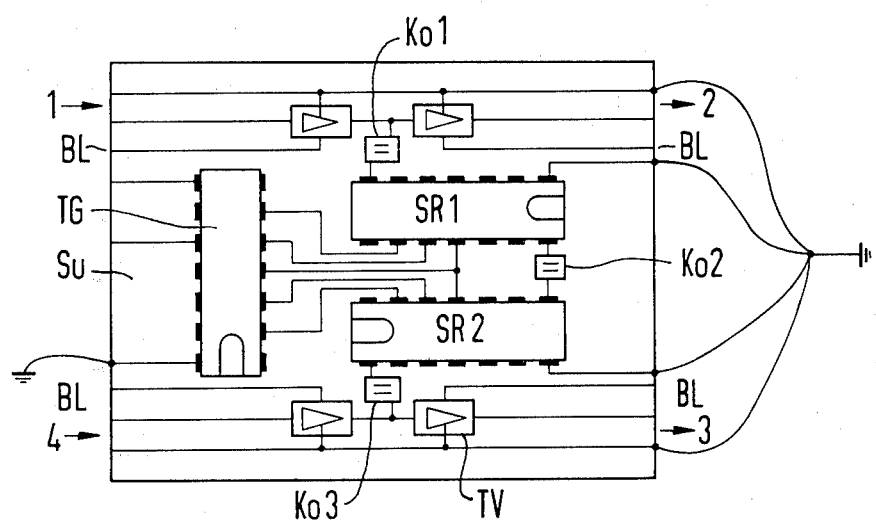
FIG. 13 is a circuit diagram of an embodiment utilizing shift registers.

FIGS. 12 and 13 illustrate possible embodiments of filter circuits in accordance with the invention. FIG. 12 shows a first form of a hybrid construction. Arranged on a base plate or a substrate Su are capacitors Ko, which latter are supplemented by inductances Jn, which are vapour-deposited or produced by the etching technique, to form transit time chains. Dividing amplifiers TV serve for decoupling purposes and further capacitors, e.g. the capacitor K1, serves to couple the line ring LR, shown in FIG. 12, to the line 1, 2. Similarly, an output line 3, 4 is coupled to the line ring LR. The individual capacitors and dividing amplifiers can be subsequently introduced as enclosed components into the line structure, which is to be considered as a printed circuit, on the substrate Su (one of the possible hybrid forms).

FIG. 13 shows an embodiment in which on a base plate Su two enclosed shift registers SR1, SR2, as line loops, are combined via capacitors Ko1, Ko2 and Ko3 to form a basic circuit as shown in FIG. 2. The shift registers are commercially available shift registers having a corresponding number of positions e.g. with eight or sixteen storage positions. Their input is in each case connected to their output. Also arranged on the base plate Su is the pulse generator TG for the shift registers. The corresponding connections are indicated with the conventional circuitry symbolism. For reasons of simplicity, here again dividing amplifiers TV are additionally provided. These can likewise be integrated circuits, for example in the form of operational amplifiers which are inserted into the base plate and are connected correspondingly to the supply lines. The additional terminals BL here serve to supply the operating voltage to these amplifiers. The earth terminals are as shown in FIG. 12.

It will thus be seen that a filter in accordance with the invention can be constructed in various forms, namely as an integrated circuit with applied components, preferably ICs, as a thin film circuit or a thick film circuit, in which case the capacitors, inductances and also resistors are in part directly applied in the thin film or thick film techniques, and finally also as pure semiconductor circuit in the IC-technique. The pass characteristics of the filter are determined by the selection of the frequency of the pulse generators. It can be subsequently changed within specific limits or set at a given value by altering the pulse train frequency.

As already mentioned, in accordance with the invention, e.g. when the bucket chain principle or the CCD principle is used, enclosed line rings or line loops are coupled to one another e.g. at positions arranged opposite each other (FIG. 14 as example for the case of surge impedance coupling m), so that a chain of rings is formed on a flat substrate surface (see FIG. 12), where the first and last ring is in each case coupled to a transmission line instead of another ring. Hybrid circuits can also be used with advantage.

I claim:

1. An electrical filter comprising, input and output lines having pairs of input and output terminals, a first charge coupled device having a plurality of charge storage cells each of a first charge storage capacity with its input connected to one input terminal of said input line and its output connected to the other input terminal of said input line, a pulse generator producing "n" phase related pulse trains at a certain frequency and supplying inputs to said charge storage cells of said first charge coupled device to move charges therethrough, a second charge coupled device having a plurality of charge storage cells each of said first charge storage capacity with its input connected to one output terminal of said output line and its output connected to the other output terminal of said output line, a pulse generator producing "n" phase related pulse trains at a certain frequency and supplying inputs to said cells of said second charge coupled device to move charges therethrough, a first non-directional coupling element coupled to an intermediate storage cell of said first charge coupled device, a second non-directional coupling element coupled to an intermediate storage cell of said second charge coupled device, a third charge coupled device having a plurality of charge storage cells of different or the same storage capacity as the storage cells of said first and second charge coupled devices with its output connected to its input, a pulse generator producing "n" phase related pulse trains at a certain frequency and supplying inputs to said cells of said third charge coupled device to move charges therethrough, one of the storage cells of said third charge coupled device coupled to said first non-directional coupling element and another of the storage cells of said third charge coupled device coupled to said second non-directional coupling element.

2. An electrical filter comprising, input and output lines having pairs of input and output terminals, a first bucket brigade device having a plurality of charge storage cells each of a first charge storage capacity with its input connected to one input terminal of said input line and its output connected to the other input terminal of said input line, a pulse generator producing "n" phase related pulse trains at a certain frequency and supplying inputs to said charge storage cells of said first bucket brigade device to move charges therethrough, a second bucket brigade device having a plurality of charge storage cells each of said first charge storage capacity with its input connected to one output terminal of said output line and its output connected to the other output terminal of said output line, a pulse generator producing "n" phase related pulse trains at a certain frequency and supplying inputs to said cells of said second bucket brigade device to move charges therethrough, a first non-directional coupling element coupled to an intermediate storage cell of said first bucket brigade device, a second non-directional coupling element coupled to an intermediate storage cell of said second bucket brigade device, a third bucket brigade device having a plurality of charge storage cells of different or the same storage capacity as the storage cells of said first and second bucket brigade devices with its output connected to its input, a pulse generator producing "n" phase related pulse trains at a certain frequency and supplying inputs to said cells of said third bucket brigade device to move charges therethrough, one of the storage cells of said third bucket brigade device coupled to said first non-directional coupling element and another of the storage cells of said third bucket brigade device coupled to said second non-directional coupling element.

3. An electrical filter according to claim 1 wherein said first and second non-directional coupling elements are resistors.

4. An electrical filter according to claim 2 wherein said first and second non-directional coupling elements are resistors.

5. An electrical filter according to claim 1 wherein said first and second non-directional coupling elements are capacitors.

6. An electrical filter according to claim 2 wherein said first and second non-directional coupling elements are capacitors.

* * * * *